United States Patent
Komoto

(10) Patent No.: US 6,956,883 B2
(45) Date of Patent: Oct. 18, 2005

(54) SEMICONDUCTOR LASER DEVICE INCLUDING LIGHT RECEIVING ELEMENT FOR RECEIVING MONITORING LASER BEAM

(75) Inventor: Satoshi Komoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/200,048

(22) Filed: Jul. 18, 2002

(65) Prior Publication Data

US 2003/0016710 A1 Jan. 23, 2003

(30) Foreign Application Priority Data

Jul. 19, 2001 (JP) ........................................ 2001-220353

(51) Int. Cl.$^7$ ................................................ H01S 5/00
(52) U.S. Cl. .............................. 372/45; 372/43; 372/44; 372/46; 372/47; 372/48; 372/49; 372/50; 372/93; 372/99
(58) Field of Search .............................. 372/43–50, 93, 372/99

(56) References Cited

U.S. PATENT DOCUMENTS

| | | | | |
|---|---|---|---|---|
| 4,031,384 A | * | 6/1977 | Sherman, Jr. ............. | 250/203.1 |
| 4,877,756 A | * | 10/1989 | Yamamoto et al. ........... | 438/25 |
| 5,783,818 A | * | 7/1998 | Manabe et al. ............. | 250/239 |
| 5,993,075 A | * | 11/1999 | Huang et al. ................ | 385/92 |
| 6,339,563 B2 | * | 1/2002 | Mori et al. ............... | 369/44.23 |
| 6,438,075 B1 | * | 8/2002 | Takeda et al. ............ | 369/44.12 |
| 6,501,868 B1 | * | 12/2002 | Kitaoka et al. ................ | 385/14 |
| 6,587,481 B1 | * | 7/2003 | Seong et al. .................... | 372/9 |

FOREIGN PATENT DOCUMENTS

| | | |
|---|---|---|
| CN | 1265529 | 9/2000 |
| JP | 62-222211 | 9/1987 |
| JP | 09-036490 | 2/1997 |
| JP | 10-256649 | 9/1998 |
| JP | 2000-252575 | 9/2000 |
| JP | 2002-033544 | 1/2002 |
| JP | 2003-513463 | 4/2003 |
| WO | 01/33607 | 5/2001 |

* cited by examiner

*Primary Examiner*—Minsun Oh Harvey
*Assistant Examiner*—Delma R. Flores-Ruiz
(74) *Attorney, Agent, or Firm*—Hogan & Hartson, LLP

(57) ABSTRACT

A semiconductor laser device has a semiconductor laser element, light receiving element, lead frame, and package. The semiconductor laser element is an element for emitting a laser beam. The light receiving element is a chip-shaped element which receives a monitoring laser beam emitted from the semiconductor laser element. The semiconductor laser element and the light receiving element are mounted on the lead frame. The package surrounds the semiconductor laser element and the light receiving element, and has a light reflecting surface on at least a portion of its inner surface.

24 Claims, 7 Drawing Sheets

SEMICONDUCTOR LASER DEVICE INCLUDING LIGHT RECEIVING ELEMENT FOR RECEIVING MONITORING LASER BEAM

CROSS-REFERENCE TO RELATED APPLICATIONS

The application is based upon and claims the benefit of priority from the prior Japanese Patent Application No. 2001-220353, filed Jul. 19, 2001, the entire contents of which are incorporated herein by reference.

BACKGROUND OF THE INVENTION

1. Field of the Invention

The present invention relates to a semiconductor laser device including a light receiving element for receiving a monitoring laser beam.

2. Description of the Related Art

The structure of a conventional semiconductor laser device will be explained below with reference to FIGS. 1A, 1B, and 1C. FIG. 1A is a plan view showing the structure of the conventional semiconductor laser device. FIG. 1B is a sectional view taken along a line 1B–1B in the plan view. FIG. 1C is a front view showing the semiconductor laser device from the side of a laser beam emitting surface.

As shown in FIGS. 1A to 1C, a semiconductor laser element mount bed (to be referred to as a semiconductor laser element hereinafter) 101 is mounted on a silicon substrate 102. A light receiving element 103 is formed in the silicon substrate 102. The silicon substrate 102 is mounted on a lead frame 104 having a mold.

Lead terminals 105 are arranged around the lead frame 104. Bonding wires 106 are formed between these lead frames 105, the silicon substrate 102, and the light receiving element 103, and between the lead frame 104 and the semiconductor laser element 101. In addition, a package 107 is formed on the lead frame 104 so as to cover the semiconductor laser element 101, the silicon substrate 102, the light receiving element 103, and the bonding wires 106.

In the semiconductor laser device, the characteristics of the semiconductor laser element 101 rapidly deteriorate with time, if stress is applied to the semiconductor laser element 101 by thermal history during assembly or generation of heat during laser oscillation. This shortens the life of the semiconductor laser element 101. To prevent this, the semiconductor laser element 101 is not directly mounted on the lead frame 104, but is mounted on a silicon substrate 102 having a relatively close linear expansion coefficient.

One end face 101A of the semiconductor laser element 101 emits a principal laser beam L1. Another end face 101B opposite to the end face 101A emits a monitoring laser beam L2. The monitoring laser beam L2 is emitted backward from the other end face 101B, and enters the light receiving element 103. The monitoring laser beam L2 is photoelectrically converted by the light receiving element 103 and detected as an electric current.

The structure of the semiconductor laser device shown in FIG. 1B makes the principal emission direction of the monitoring laser beam L2 parallel to the light receiving surface of the light receiving element 103. The principal emission direction is one of the emission directions of the monitoring laser beam L2, in which the optical intensity of the emitted laser beam L2 is a maximum.

As described above, when the light receiving surface of the light receiving element 103 is parallel to the principal emission direction of the monitoring laser beam L2, most of the monitoring laser beam L2 does not enter the light receiving element 103, but is absorbed as useless light by the package 107 and the lead frame 104, or scattered. However, since the monitoring laser beam L2 is emitted with a certain angle, the light receiving element 103 picks up a portion of the monitoring laser beam L2 outside the principal emission direction, and converts the light into a monitoring electric current. In the conventional semiconductor laser device, therefore, the light receiving ratio at which the light receiving element 103 receives the monitoring laser beam L2 is very low. To minimize the inconvenience, the light receiving element 103 is usually positioned as close as possible to the monitoring laser beam emission point. This largely limits the position of the semiconductor laser element 101.

Also, scattered light which does not enter the light receiving element 103 but is reflected from the package 107 and the lead frame 104 enters the semiconductor laser element 101. The scattered light functions as noise to disturb laser oscillation.

BRIEF SUMMARY OF THE INVENTION

A semiconductor laser device according to an aspect of the present invention comprises a semiconductor laser element which emits a laser beam, a chip-shaped light receiving element which receives a monitoring laser beam emitted from the semiconductor laser element, a lead frame on which the semiconductor laser element and the light receiving element are mounted, and a package which surrounds the semiconductor laser element and the light receiving element, the package having a light reflecting surface on at least a portion of its inner surface.

DETAILED DESCRIPTION OF THE INVENTION

Figure 1A:
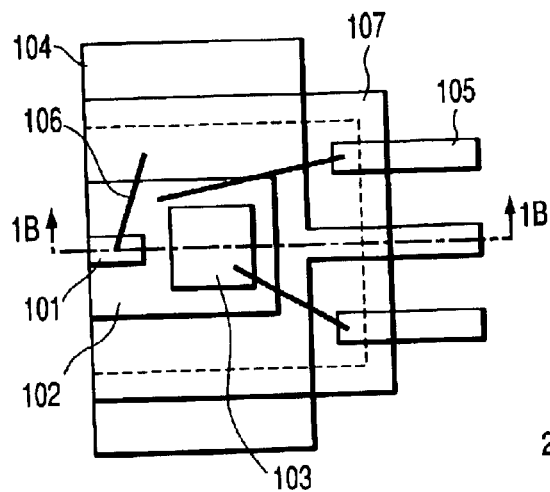
FIG. 1A is a plan view showing the structure of a conventional semiconductor laser device.

Embodiments of the present invention will be described below with reference to the accompanying drawing. In the following description, the same reference numerals denote the same parts throughout the drawing, and a repetitive description thereof will be omitted.

First Embodiment

A semiconductor laser device according to the first embodiment of the present invention will be described below.

Figure 2A:
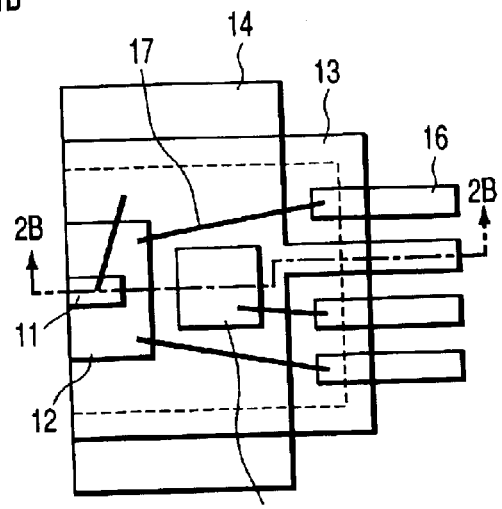
FIG. 2A is a plan view showing the structure of a semiconductor laser device according to the first embodiment of the present invention.
Figure 2B:
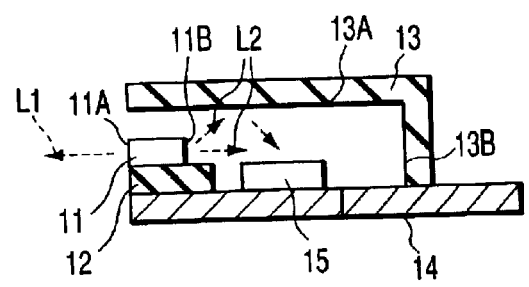
FIG. 2B is a sectional view taken along a line 2B—2B in the plan view shown in FIG. 2A.
Figure 2C:
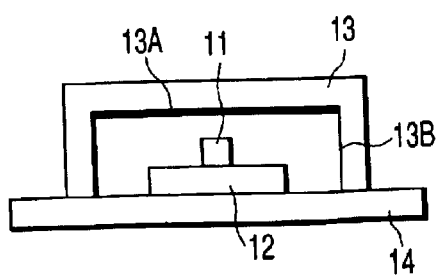
FIG. 2C is a front view showing the semiconductor laser device of the first embodiment from the side of a laser beam emission surface.

FIG. 2A is a plan view showing the structure of the semiconductor laser device of the first embodiment. FIG. 2B is a sectional view taken along a line 2B—2B in the plan view. FIG. 2C is a front view showing the semiconductor laser device from the side of a laser beam emission surface.

As shown in FIGS. 2A to 2C, a semiconductor laser element 11 is mounted on a ceramic substrate 12. A mold serving as a lower package 13 is formed on a lead frame 14. On the lead frame 14, the ceramic substrate 12 and a light receiving element 15 are mounted. The lead frame 14 is made of, e.g., a plate-shaped metal material.

Lead terminals 16 are arranged around the lead frame 14. Bonding wires 17 are formed between these lead terminals 16, the ceramic substrate 12, and the light receiving element 15. A bonding wire 17 is also formed between the lead frame 14 and the semiconductor laser element 11. These bonding wires 17 are omitted in FIGS. 2B and 2C.

An upper package 13 is formed on the lead frame 14 so as to cover the semiconductor laser element 11, the ceramic substrate 12, the light receiving element 15, and the bonding wires 17. As shown in FIGS. 2B and 2C, the package 13 has an upper surface 13A and a side surface 13B as inner surfaces covering the semiconductor laser element 11, the ceramic substrate 12, the light receiving element 15, and the bonding wires 17. The upper surface 13A is a light reflecting surface which reflects a laser beam emitted from the semiconductor laser element 11.

One end face 11A of the semiconductor laser element 11 emits a principal laser beam L1. Another end face 11B opposite to the end face 11A emits a monitoring laser beam L2. The monitoring laser beam L2 is emitted backward from the other end face 11B, and enters the light receiving element 15. The monitoring laser beam L2 is photoelectrically converted by the light receiving element 15 and detected as an electric current.

The structure and manufacturing method of the above semiconductor laser device will be explained in detail below.

First, a lead frame material is pressed to form a desired pattern, and forming is performed to form the lead frame 14. On the lead frame 14, a resin serving as the lower package 13 is molded by, e.g., injection molding to surround a portion on which the semiconductor laser element 11 is to be mounted. As the base material of the lead frame 14, a copper-based material is used by taking account of the radiation of heat when the semiconductor laser element 11 is in operation. An iron-based material such as 42 alloy can also be used in some cases. By taking the ease of assembly into consideration, an appropriate coating such as gold or palladium plating is formed on the lead frame 14 in advance.

Next, on the lead frame 14 on which the lower package 13 is molded, the semiconductor laser element 11 and the light receiving element 15 are mounted via, e.g., the ceramic substrate 12. As explained in description of the prior art, the semiconductor laser element 11 rapidly deteriorates with time if it is in direct contact with the lead frame 14. Therefore, a ceramic substrate 11 made of, e.g., aluminum nitride having a linear expansion coefficient close to that of the semiconductor laser element 11 and having thermal conductivity higher than that of silicon is generally inserted between the lead frame 14 and the semiconductor laser element 11.

An electrode is formed on the surface of the ceramic substrate 12 beforehand by gold deposition and patterning. The semiconductor laser element 11 is fixed to the ceramic substrate 12 by melt adhesion by melting an adhesive such as gold-tin solder by heating it to about 300° C., and then hardening the adhesive. This ensures electrical conduction between the semiconductor laser element 11 and the electrode on the ceramic substrate 12. In some cases, a silver epoxy adhesive or the like is used instead of solder. However, the use of the silver epoxy adhesive is unsuitable to the embodiment because problems such as wetting and overflow of the adhesive and contamination by the generated gas arise.

On the back surface of the semiconductor laser device, the lead frame 14 is exposed from a portion of the package 13 by taking account of heating when the semiconductor laser element 11 is adhered, and the radiation of heat after the semiconductor laser device is packaged. The portion of the package 13 is a portion at the back of the position where the semiconductor laser element 11 is mounted with the lead frame 14 sandwiched between them.

The semiconductor laser element 11 and the light receiving element 15 are similarly placed on a plane parallel to the surface of the lead frame 14. Hence, to tilt the light receiving element 15 toward the semiconductor laser element 11 so as to allow the light receiving element 15 to directly receive the monitoring laser beam L2 from the semiconductor laser element 11, the surface of the lead frame 14 on which the light receiving element 15 is mounted must be inclined. To tilt the mounting surface of the lead frame 14, it is necessary to bend the lead frame 14 to form a surface which is inclined with respect to the surface on which the ceramic substrate 12 is mounted. If the inclined surface is to be formed on the lead frame 14, product design and device design are extremely limited in order to allow a series of lead frames to flow in a line such as a hoop line. This poses serious problems such as deterioration of the product characteristics, an increase in the installation cost, and a lowering of the assembly speed.

Also, the mounting portion of the light receiving element 15 on the lead frame 14 sinks into the molded resin. This makes high-temperature heating difficult when the light receiving element 15 is mounted as described above. This significantly worsens the ease of assembly. In embodiments of the present invention including the first embodiment, therefore, the semiconductor laser element 11, the ceramic substrate 12, and the light receiving element 15 mounted on the lead frame 14 are arranged substantially parallel to the lead frame 14.

Details of the package of the first embodiment will be explained below. The package 13 is made up of lower and upper portions. As described above, the lower package 13 is molded beforehand in close contact with the lead frame 14. The semiconductor laser element 11 is thermally adhered onto the molded lead frame 14. Accordingly, the lower package is made of, e.g., heat-resistant engineering plastic (e.g., polyetheretherketone (PEEK) or liquid crystal polymer (LCP). Examples of other usable materials are polysulfone (PSF), polyethersulfone (PES), polyphenylene sulfide (PPS), polyphthalamide (PPA), polyarylate (PAR) (U polymer), polyamidoimide (PAI), polyetherimide (PEI), polyimide (PI), and polytetrafluoroethylene (FR (PTFE)). When heat resistance, chemical resistance, mechanical strength, lead adhesion, molding properties, generated gas, and cost are totally taken into consideration, PEEK, LCP, or PPA is more suitable to embodiments of the present invention including the first embodiment.

From the viewpoint of heat resistance, thermosetting resins such as epoxy are also usable in addition to the above-mentioned thermoplastic resins. However, these thermosetting resins are not suited to embodiments of the present invention because they have problems such as the formation of burrs after transfer molding and fluctuations in characteristics at high temperatures.

After assembly in the semiconductor laser device is completed, e.g., after the semiconductor laser element 11 is mounted and connections are made by the bonding wires 17, the upper package 13 is precisely attached as a lid to the lower package by, e.g., an adhesive, thermal contact bonding, ultrasonic adhesion, press fit, or fitting.

The upper and lower packages 13 can be simply split into upper and lower portions, or an upper portion can be fitted into a substantially box-like lower portion. In the latter case, it is possible to form a projection on one junction surface and a recess in the other so that these projection and recess engage each other when the upper portion is pushed into the lower portion. Also, a projection having a return can be formed on one junction surface so as to be caught by a recessed formed in the other when the upper portion is pushed into the lower portion. Furthermore, the upper package can be composed of two or more parts.

In the first embodiment, a silicon-based adhesive is applied to the adhesion surface of the upper or lower package 13. After that, the upper portion is attached to the lower portion, and the adhesive is thermally cured at about 200° C., thereby adhering the upper package to the lower package.

The material of the package 13 is so selected that the light reflectance of the inner surface of the package 13 increases. Alternatively, the inner surface of the package 13 is so treated as to raise the light reflectance of the inner surface. The inner surface of the package 13 is a surface which faces the semiconductor laser element 11 placed inside the package having a hollow structure. That surface of the package of the semiconductor laser device, which is seen when the package is viewed from the outside is the outer surface.

In the first embodiment, it is particularly effective to form a light reflecting surface on the side opposite to the light receiving surface of the light receiving element 15, i.e., on the inner surface (the upper surface 13A) of the upper package 13. When this is taken into consideration, a white heat-resistant PBT resin or the like having high light reflectance is suited as the material of the upper package 13. When the PBT resin is to be used, 10% to 30% of glass fibers are mixed by taking account of the heat resistance, light reflectance, and molding properties. In the embodiment, the upper package is formed by injection molding of PBT having a deflection temperature under load of about 210° C. to 220° C., by taking the curing temperature of the adhesive into account. The fire retardancy of PBT can be UL-94V0 class.

Similar effects can be obtained by using a material formed by plating a resin (e.g., ABS) with a metal (e.g., chromium), as the material of the package 13. Similar effects can also be obtained by using a glossy metal material or the like. In the embodiment, PBT is used by taking, e.g., the manufacturing cost of the package 13 into consideration.

A light reflecting surface can also be formed on the lower package 13 molded into the lead frame 14. In addition, the light reflecting surface can be formed either partially or entirely on the inner surface of the package 13. For example, only that portion of the inner surface of the package 13, which receives the monitoring laser beam L2 having a certain width from the semiconductor laser element 11 need be a light reflecting surface; the rest of the inner surface need not be a light reflecting surface. That is, only the monitoring laser beam L2 incident portion of the inner surface of the package 13 need be a desired light reflecting surface, and the rest of the inner surface need not be a light reflecting surface. Likewise, when the incident portion has the shape of the desired light reflecting surface, the optical shape of the rest of the inner surface need not be taken into consideration. On the contrary, it is sometimes desirable that a portion other than the necessary portion, particularly a portion which faces the semiconductor laser element be positively formed into a non-reflecting surface, since useless reflected light reenters the semiconductor laser element to produce noise. As described above, the material cost and the molding cost can be saved by limiting a portion which functions as the light reflecting surface.

To realize a low cost and a small size by minimizing the area of that portion of the inner surface of the package 13, which functions as the light reflecting surface, the light reflecting surface is desirably positioned as close as possible to the semiconductor laser element 11. Additionally, the distance from the semiconductor laser element 11 to the light reflecting surface is preferably shorter than the distance from the semiconductor laser element 11 to the light receiving element 15. To realize the conditions, in many embodiments of the present invention, the light reflecting surface is positioned on a straight line which passes the laser beam emission point and which is parallel to the principal laser beam emission direction, at a distance equal to or shorter than the distance to the light receiving element 15. If a plurality of semiconductor laser elements are arranged on the lead frame, lead cutting is finally performed to separate the individual semiconductor laser devices.

The outer shape of the completed semiconductor laser device is as shown in FIG. 2A. That is, the four outer leads for electrically connecting to the outside and the slat (lead frame 14) for positioning during packaging and for heat radiation project from the package 13 to the two sides. The leads (outer leads) for electrical connection can also be protruded from the side surfaces of the semiconductor laser device, depending on a method of mounting the device onto a pickup. Furthermore, the slat for heat radiation can protrude backward from the package of the semiconductor laser device. Holes for screwing or the like are sometimes formed in the end portions of the slat.

A described above, the semiconductor laser device for two-wavelength oscillation has four leads: two for application to the semiconductor laser element 11, one for extracting an electric current from the light receiving element 15, and one for common grounding. The polarity of each lead is determined on the basis of the polarity of the semiconductor laser element 11. A semiconductor laser device for one-wavelength oscillation has a total of three leads including one for application to the semiconductor laser element 11. The number of leads is determined on the basis of, e.g., the number of oscillation wavelengths of the semiconductor laser element 11, or, if a plurality of semiconductor laser elements are mounted, the number of these semiconductor laser elements.

The lead frame 14 is so designed that all components exposed from the package 13, such as the slat and the rear-surface heat radiating plate, are grounded, except for the leads for electrical connection. This is to prevent a short circuit when the semiconductor laser device is packaged into a metal housing such as a pickup.

An opening for extracting the principal laser beam from the semiconductor laser element 11 is formed in the front surface of the semiconductor laser device. In some cases, a transparent member such as glass can also be installed in the opening.

A semiconductor laser device according to a modification of the above first embodiment will be explained below.

The modification is made by taking account of press fit into a pickup housing and optical axis adjustment in the rotating direction, when the semiconductor laser device of the first embodiment is packaged into the pickup housing.

Figure 3A:
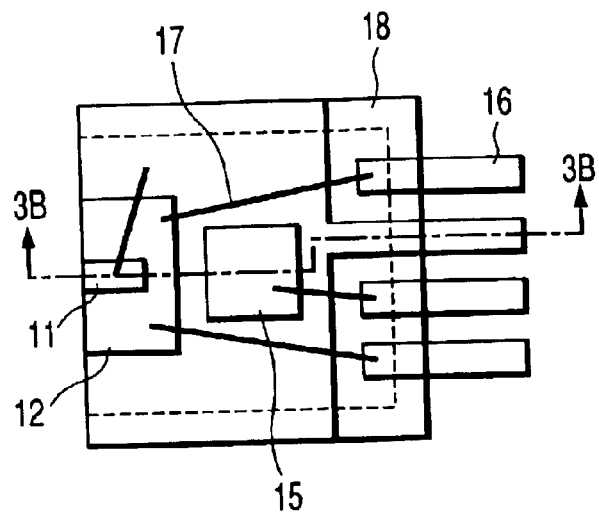
FIG. 3A is a plan view showing the structure of a semiconductor laser device according to a modification of the first embodiment of the present invention.
Figure 3B:
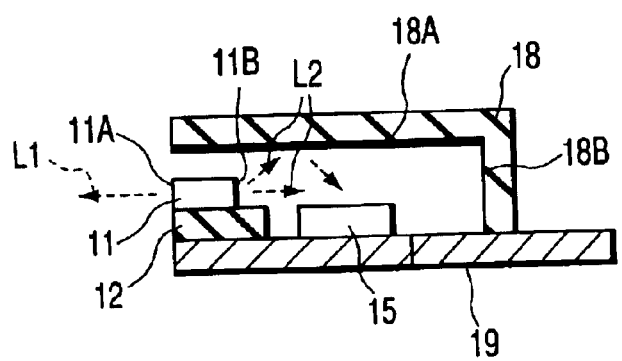
FIG. 3B is a sectional view taken along a line 3B—3B in the plan view shown in FIG. 3A.
Figure 3C:
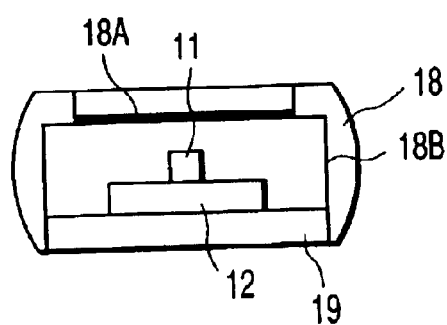
FIG. 3C is a front view showing the semiconductor laser device of the modification of the first embodiment from the side of a laser beam emission surface.

FIG. 3A is a plan view showing the structure of the semiconductor laser device according to the modification of the first embodiment. FIG. 3B is a sectional view taken along a line 3B—3B in the plan view. FIG. 3C is a front view showing the semiconductor laser device from the side of a laser beam emission surface.

As shown in FIGS. 3A to 3C, a package 18 forming the side surfaces of the semiconductor laser device is partially formed into a cylindrical shape, so that the semiconductor laser device can be rotated after being press-fitted into a cylindrical hole of a pickup housing. Additionally, a lead frame 19 has no slat. In the arrangement, a laser beam emission point requiring rotational adjustment is positioned in the center of the cylinder. As shown in FIG. 3B, the inner surfaces of the package 18 have an upper surface 18A and a side surface 18B. The upper surface 18A is a light reflecting surface which reflects a monitoring laser beam L2 emitted from a semiconductor laser element 11.

If an upper package 18 is exposed to those side surfaces of the semiconductor laser device, which are formed by a lower package 18, steps are produced on these side surfaces, so the package 18 cannot function as an outer shape reference for assembly accuracy and component accuracy any longer. To prevent this, the upper package is fitted inside the lower package.

In the first embodiment and its modification as described above, the inner surface of a package is formed into a light reflecting surface. Accordingly, a monitoring laser beam which is conventionally absorbed and scattered as useless light by the surroundings is reflected toward a light receiving element and fed into the light receiving element. Consequently, the monitoring laser beam can be effectively used to check the state of a principal laser beam emitted from the semiconductor laser element. Also, the first embodiment and its modification can realize an inexpensive, highly productive, microminiature semiconductor laser device in which the efficiency of reception of a monitoring laser beam is greatly increased without additionally installing any expensive component such as a reflecting plate.

Second Embodiment

A semiconductor laser device according to the second embodiment of the present invention will be described below. In the second embodiment, the same reference numerals as in the first embodiment denote the same parts, and a detailed description thereof will be omitted.

Figure 4A:
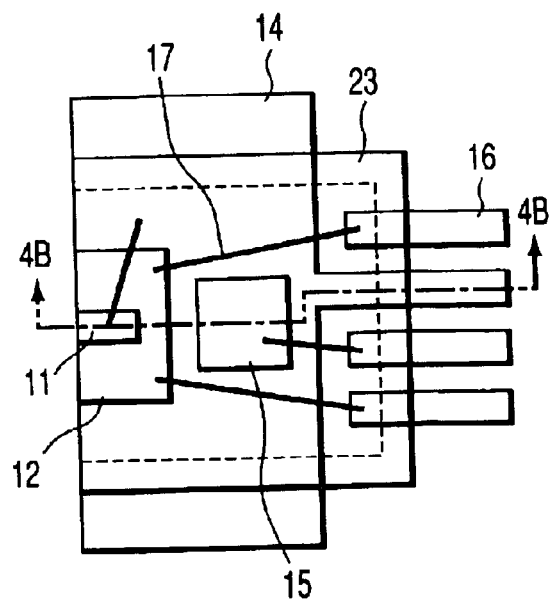
FIG. 4A is a plan view showing the structure of a semiconductor laser device according to the second embodiment of the present invention.
Figure 4B:
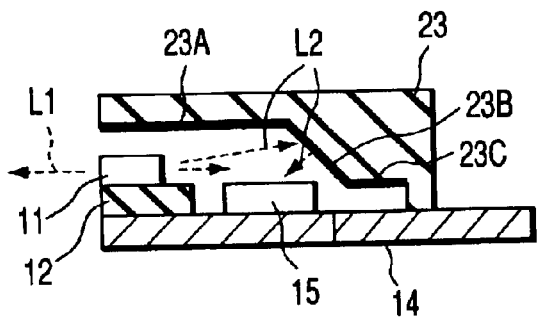
FIG. 4B is a sectional view taken along a line 4B—4B in the plan view shown in FIG. 4A.

FIG. 4A is a plan view showing the structure of the semiconductor laser device of the second embodiment. FIG. 4B is a sectional view taken along a line 4B—4B in the plan view. FIG. 4C is a front view showing the semiconductor laser device from the side of a laser beam emission surface.

As shown in FIG. 4B, the inner surface of a package 23 is a light reflecting surface, and a portion of the inner surface as a light reflecting surface is an inclined surface. That is, the inner surface of the package 23 which covers a light receiving element 15 has an upper surface 23A, an inclined surface 23B, and an upper surface 23C. These upper surface 23A, inclined surface 23B, and upper surface 23C are light reflecting surfaces for reflecting a monitoring laser beam L2 emitted from a semiconductor laser element 11. In this structure, only the inclined surface 23B can also be a light reflecting surface. The angle of the inclined surface as a light reflecting surface can be set at a predetermined angle at which the light receiving efficiency of the light receiving element 15 rises. In the embodiment, the angle of the inclined surface 23B is set at 45° with respect to the principal emission optical axis of the monitoring laser beam L2.

When at least a portion of the inner surface of the package 23 is formed into an inclined light reflecting surface as described above, the monitoring laser beam L2 from the semiconductor laser element 11 can be efficiently fed into the light receiving element 15.

In the second embodiment, even when the installation locations of the semiconductor laser element 11 and the light receiving element 15 are changed, the amount of the monitoring laser beam L2 incident on the light receiving element 15 can be optimized by properly setting the angle of the inclined surface 23B.

A semiconductor laser device according to a modification of the second embodiment will be explained below.

Figure 4D:
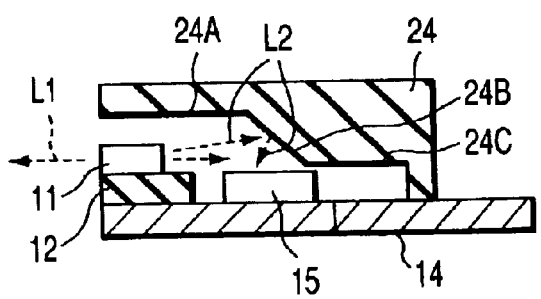
FIG. 4D is a sectional view corresponding to the line 4B—4B, which shows a semiconductor device of a modification of the second embodiment.
Figure 4C:
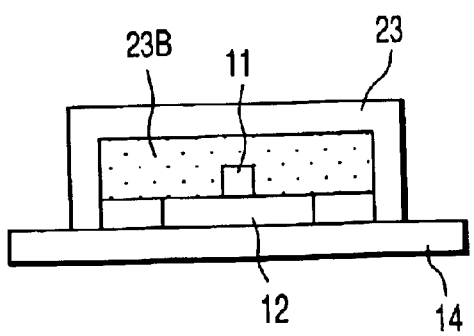
FIG. 4C is a front view showing the semiconductor laser device of the second embodiment from the side of a laser beam emission surface.

FIG. 4D is a sectional view corresponding to FIG. 4B, which shows the modification of the second embodiment.

In the modification, the inner surface of a package 24 which covers a light receiving element 15 has an upper surface 24A, an inclined surface 24B, and an upper surface 24C. These upper surface 24A, inclined surface 24B, and upper surface 24C are light reflecting surfaces which reflect a monitoring laser beam L2 emitted from a semiconductor laser element 11. In the modification, only the inclined surface 24B can also be formed into a light reflecting surface.

Compared to the structure shown in FIG. 4B, in the modification the inclined inner surface 24B of the package 24 is positioned close to the emission point of the semiconductor laser element 11 and immediately above the light receiving element 15. The angle of the inclined surface 24B as a light reflecting surface can be set at a predetermined angle at which the light receiving efficiency increases. In the modification, as in the second embodiment described above, the angle of the inclined surface 24B is set at 45° with respect to the principal emission optical axis of the monitoring laser beam L2.

When the inclined surface 24B of the package is thus positioned immediately above the light receiving element 15, the light reflecting surface approaches the laser beam emission point of the semiconductor laser element 11 as described previously. This facilitates miniaturization of the semiconductor laser device.

In the second embodiment and its modification as described above, the inner surface of a package is formed into a light reflecting surface, and a portion of the light reflecting surface is formed into an inclined surface. Accordingly, a monitoring laser beam which is conventionally absorbed and scattered as useless light by the surroundings is reflected toward a light receiving element and fed into the light receiving element. Consequently, the monitoring laser beam can be effectively used to check the state of a principal laser beam emitted from the semiconductor laser element. Also, the second embodiment and its modification can realize an inexpensive, highly productive, microminiature semiconductor laser device in which the efficiency of reception of a monitoring laser beam is greatly increased without additionally installing any expensive component such as a reflecting plate.

Third Embodiment

A semiconductor laser device according to the third embodiment of the present invention will be described below. In the third embodiment, the same reference numerals as in the first embodiment denote the same parts, and a detailed description thereof will be omitted.

Figure 5A:
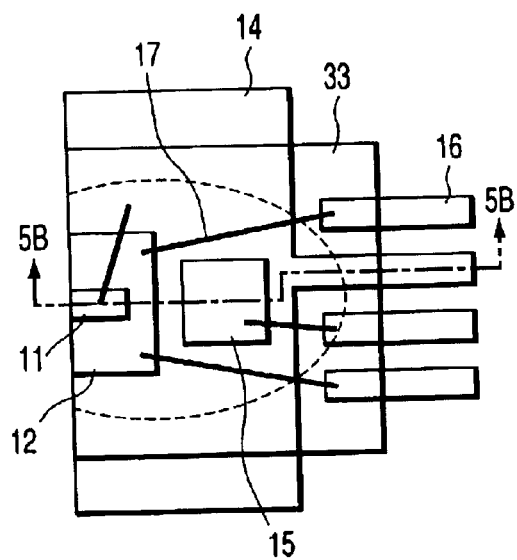
FIG. 5A is a plan view showing the structure of a semiconductor laser device according to the third embodiment of the present invention.
Figure 5B:
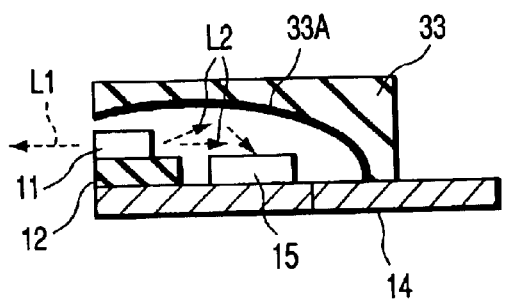
FIG. 5B is a sectional view taken along a line 5B—5B in the plan view shown in FIG. 5A.
Figure 5C:
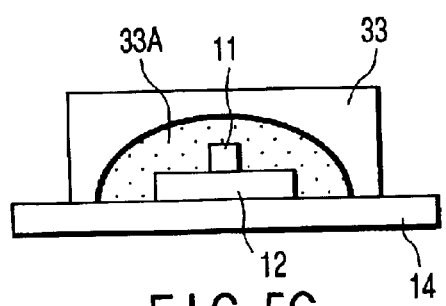
FIG. 5C is a front view showing the semiconductor laser device of the third embodiment from the side of a laser beam emission surface.

FIG. 5A is a plan view showing the structure of the semiconductor laser device of the third embodiment. FIG. 5B is a sectional view taken along a line 5B—5B in the plan view. FIG. 5C is a front view showing the semiconductor laser device from the side of a laser beam emission surface.

As shown in FIG. 5B, the inner surface of a package 33 is a light reflecting surface, and a portion of the inner surface as a light reflecting surface has an ellipsoidal shape. That is, the inner surface of the package 33 which covers a light receiving element 15 has an ellipsoidal shape 33A. The ellipsoidal shape 33A is a light reflecting surface which reflects a monitoring laser beam L2 emitted from a semiconductor laser element 11. Of the ellipsoidal shape 33A, only a portion to be irradiated with the monitoring laser beam L2 can also be formed into a light reflecting surface.

In the embodiment in which the inner surface of the package 33 has the ellipsoidal shape 33A, the laser beam emission point is positioned in one focal point, and the light receiving surface of the light receiving element 15 is positioned in the other focal point. In this manner, the monitoring laser beam L2 can be concentrated to the light receiving surface of the light receiving element 15 by the optical characteristics of the ellipsoid.

When at least a portion of the inner surface of the package 33 is thus formed into an ellipsoidal light reflecting surface, the monitoring laser beam L2 from the semiconductor laser element 11 can be efficiently fed into the light receiving element 15. Note that the ellipsoid includes a sphere.

In embodiments including the third embodiment of the present invention, a monolithic two-wavelength semiconductor laser element is used as a semiconductor laser element. The two-wavelength semiconductor laser element can singly emit red and infrared laser beams having two different wavelengths. The two-wavelength semiconductor laser element has an infrared emitting unit and a red emitting unit. The infrared emitting unit has a gallium-arsenic substrate and an aluminum-gallium-arsenic double hetero structure active layer. The red emitting unit has the same substrate and an indium-gallium-aluminum-phosphor multiple quantum well structure active layer. Both the red and infrared emitting units are semiconductor laser elements having a ridge structure called SBR (Selectively Buried Ridge).

The spacing between the two light emitting units is determined on the basis of the required characteristics of principal laser beams emitted from the front surface of the semiconductor laser element. In the embodiment, the spacing between the two light emitting units is, e.g., 110 $\mu$m. The spacing between two monitoring laser beams emitted from the rear surface of the semiconductor laser element is the same as the spacing between the two principal laser beams emitted from the front surface of the semiconductor laser element, owing to the structure of the semiconductor laser element.

Figure 1B:
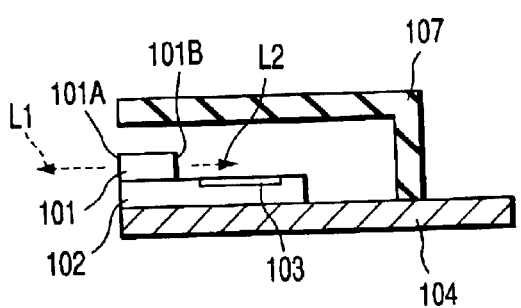
FIG. 1B is a sectional view taken along a line 1B—1B in the plan view shown in FIG. 1A.
Figure 1C:
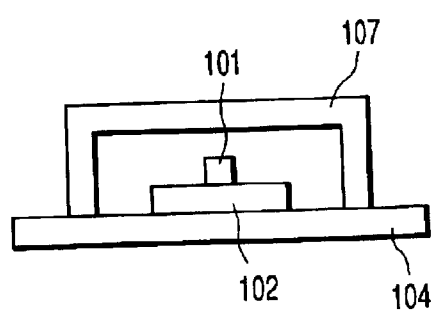
FIG. 1C is a front view showing the conventional semiconductor laser device from the side of a laser beam emission surface.

If a DVD/CD pickup head which mounts the semiconductor laser device requires the spacing between the principal laser beams to be widened, the spacing between the monitoring laser beams also widens. Therefore, in the conventional structure as shown in FIGS. 1A to 1C, it is necessary to make some changes, e.g., increase the area of the light receiving element. This poses problems such as an increase in the size of the semiconductor laser device itself.

The third embodiment, however, can decrease the size of the light receiving element by the light-gathering effect of the light reflecting surface and contribute to miniaturization of the semiconductor laser device. In addition, even when a plurality of semiconductor laser elements are arranged, the arrangement of these elements can be maintained because the light reflecting surface shape is changed only slightly in accordance with the laser beam spacing.

Also, even when a semiconductor laser element is not a monolithic one, a small semiconductor laser device can be realized by using the above effect. That is, when a red emitting laser element and an infrared emitting laser element are mounted at a desired spacing on a lead frame, a small light receiving element can be used if the shape of the light reflecting surface is optimally designed in accordance with the arrangement of these two laser elements. As an application of the above effect, it is possible to miniaturize a three-wavelength semiconductor laser device which uses blue, red, and infrared lasers, or a two-wavelength semiconductor laser device which uses two of these three lasers.

A semiconductor laser device according to a modification of the third embodiment will be explained below.

Figure 6A:
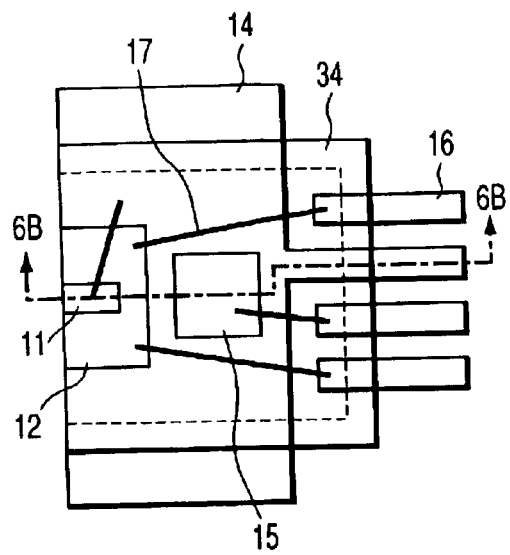
FIG. 6A is a plan view showing the structure of a semiconductor laser device according to a modification of the third embodiment of the present invention.
Figure 6B:
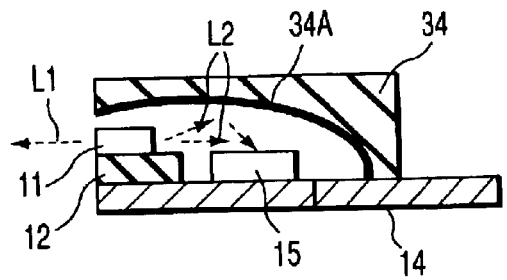
FIG. 6B is a sectional view taken along a line 6B—6B in the plan view shown in FIG. 6A.
Figure 6C:
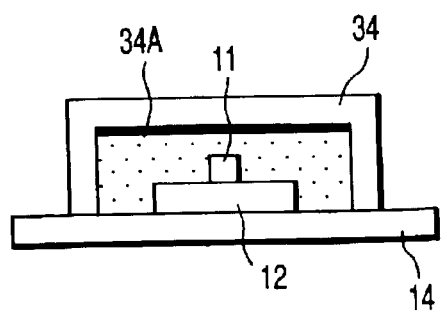
FIG. 6C is a front view showing the semiconductor laser device of the modification of the third embodiment from the side of a laser beam emission surface.

FIG. 6A is a plan view showing the structure of the semiconductor laser device according to the modification of the third embodiment. FIG. 6B is a sectional view taken along a line 6B—6B in the plan view. FIG. 6C is a front view showing the semiconductor laser device from the side of a laser beam emission surface.

As shown in FIGS. 6A to 6C, the inner surface of a package 34 can also be an elliptical cylindrical surface shape 34A, rather than an ellipsoidal shape. That is, as shown in FIG. 6B, the inner surface (light reflecting surface) of the package 34 has an elliptical shape in a section along the emission direction of a monitoring laser beam L2. As shown in FIG. 6C, the inner surface of the package 34 has a linear shape when viewed from the side of the laser beam emission surface.

The radiation distribution of the laser beam from the semiconductor laser element 11 generally exhibits an elliptical distribution centering around the principal emission direction and having a certain aspect ratio. Therefore, depending on the size and position of the light receiving element 15, no high light-gathering power may be required in the minor-axis direction (the direction parallel to the surface on which the laser element is placed) of the ellipse. When this is the case, an elliptical cylindrical surface which can be formed more easily than an ellipsoid is more advantageous from the viewpoint of manufacturing cost. Note that the elliptical cylindrical surface includes a circular cylindrical surface.

In the third embodiment and its modification as described above, the inner surface of a package is formed into a light reflecting surface, and the light reflecting surface is formed into an ellipsoidal shape or an elliptical cylindrical surface shape. Accordingly, a monitoring laser beam which is conventionally absorbed and scattered as useless light by the surroundings is reflected toward a light receiving element and fed into the light receiving element. Consequently, the monitoring laser beam can be effectively used to check the state of a principal laser beam emitted from the semiconductor laser element. Also, the second embodiment and its modification can realize an inexpensive, highly productive, microminiature semiconductor laser device in which the efficiency of reception of a monitoring laser beam is greatly increased without additionally installing any expensive component such as a reflecting plate.

Fourth Embodiment

A semiconductor laser device according to the fourth embodiment of the present invention will be described below. In the fourth embodiment, the same reference numerals as in the first embodiment denote the same parts, and a detailed description thereof will be omitted.

Figure 7A:
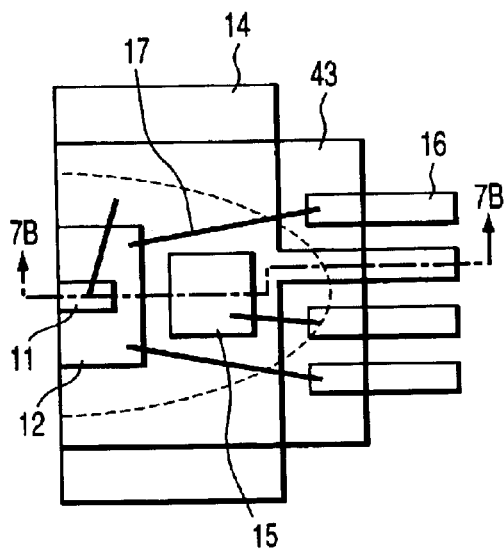
FIG. 7A is a plan view showing the structure of a semiconductor laser device according to the fourth embodiment of the present invention.
Figure 7B:
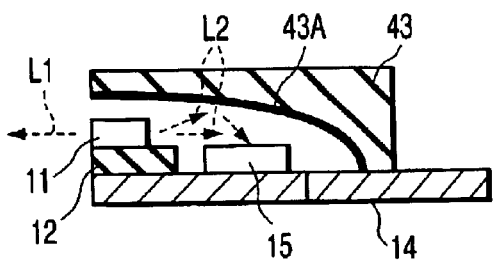
FIG. 7B is a sectional view taken along a line 7B—7B in the plan view shown in FIG. 7A.
Figure 7C:
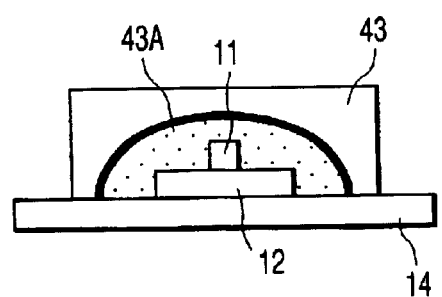
FIG. 7C is a front view showing the semiconductor laser device of the fourth embodiment from the side of a laser beam emission surface.

FIG. 7A is a plan view showing the structure of the semiconductor laser device of the fourth embodiment. FIG. 7B is a sectional view taken along a line 7B—7B in the plan view. FIG. 7C is a front view showing the semiconductor laser device from the side of a laser beam emission surface.

As shown in FIG. 7B, the inner surface of a package 43 is a light reflecting surface, and a portion of the inner surface as a light reflecting surface has a paraboloidal shape 43A. That is, the inner surface of the package 43 which covers a light receiving element 15 has the paraboloidal shape 43A. The paraboloidal shape 43A is a light reflecting surface which reflects a monitoring laser beam L2 emitted from a semiconductor laser element 11. Of the paraboloidal shape 43A, only a portion to be irradiated with the monitoring laser beam L2 can also be formed into a light reflecting surface.

In the embodiment in which the inner surface of the package 43 has the paraboloidal shape 43A, a laser beam can be regarded as a substantially parallel beam if the laser beam emission point is far from the light receiving element 15. Therefore, when the light receiving surface of the light receiving element 15 is positioned in the focal point of the paraboloid, the monitoring laser beam can be concentrated to the light receiving surface of the light receiving element 15 by the optical characteristics of the paraboloid.

When at least a portion of the inner surface of the package 43 is thus formed into a paraboloidal light reflecting surface, the monitoring laser beam L2 from the semiconductor laser element 11 can be efficiently fed into the light receiving element 15. In the fourth embodiment, an application analogous to that in the third embodiment can be made by using the light-gathering effect.

A semiconductor laser device according to a modification of the fourth embodiment will be explained below.

Figure 8A:
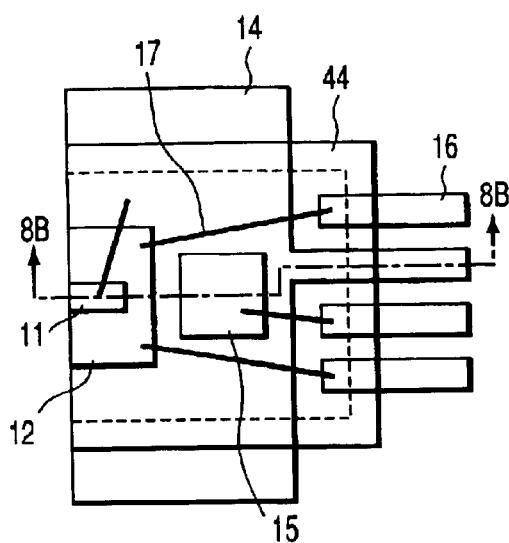
FIG. 8A is a plan view showing the structure of a semiconductor laser device according to a modification of the fourth embodiment of the present invention.
Figure 8B:
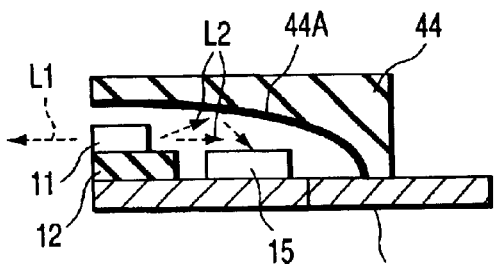
FIG. 8B is a sectional view taken along a line 8B—8B in the plan view shown in FIG. 8A.
Figure 8C:
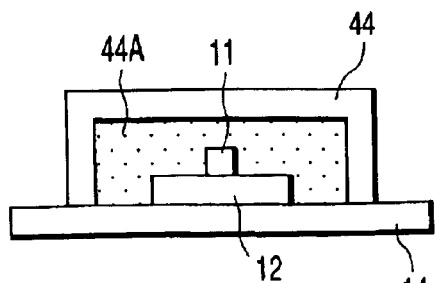
FIG. 8C is a front view showing the semiconductor laser device of the modification of the fourth embodiment from the side of a laser beam emission surface.

FIG. 8A is a plan view showing the structure of the semiconductor laser device according to the modification of the fourth embodiment. FIG. 8B is a sectional view taken along a line 8B—8B in the plan view. FIG. 8C is a front view showing the semiconductor laser device from the side of a laser beam emission surface.

As shown in FIGS. 8A to 8C, the inner surface of a package 44 can also be a parabolic cylindrical surface shape 44A, rather than a paraboloidal shape. That is, as shown in FIG. 8B, the inner surface (light reflecting surface) of the package 44 has a parabolic shape in a section along the emission direction of a monitoring laser beam. As shown in FIG. 8C, the inner surface of the package 44 has a linear shape when viewed from the side of the laser beam emission surface.

As described previously, the radiation distribution of the laser beam from the semiconductor laser element 11 generally exhibits an elliptical distribution centering around the principal emission direction and having a certain aspect ratio. Therefore, depending on the size and position of the light receiving element 15, no high light-gathering power may be required in the minor-axis direction (the direction parallel to the surface on which the laser element is placed) of the ellipse. When this is the case, a parabolic cylindrical surface which can be formed more easily than a paraboloid is more advantageous from the viewpoint of manufacturing cost.

In the fourth embodiment and its modification as described above, the inner surface of a package is formed into a light reflecting surface, and the light reflecting surface is formed into a paraboloidal shape or a parabolic cylindrical surface shape. Accordingly, a monitoring laser beam which is conventionally absorbed and scattered as useless light by the surroundings is reflected toward a light receiving element and fed into the light receiving element. Consequently, the monitoring laser beam can be effectively used to check the state of a principal laser beam emitted from the semiconductor laser element. Also, the fourth embodiment and its modification can realize an inexpensive, highly productive, microminiature semiconductor laser device in which the efficiency of reception of a monitoring laser beam is greatly increased without additionally installing any expensive component such as a reflecting plate.

Fifth Embodiment

A semiconductor laser device according to the fifth embodiment of the present invention will be described below. In the fifth embodiment, the same reference numerals as in the first embodiment denote the same parts, and a detailed description thereof will be omitted.

Figure 9A:
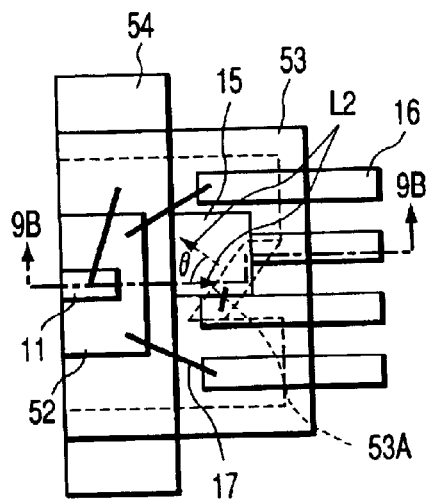
FIG. 9A is a plan view showing the structure of a semiconductor laser device according to the fifth embodiment of the present invention.
Figure 9B:
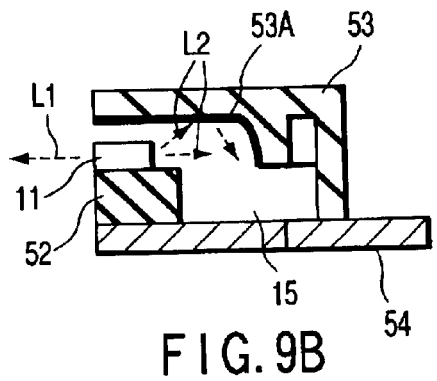
FIG. 9B is a sectional view taken along a line 9B—9B in the plan view shown in FIG. 9A.
Figure 9C:
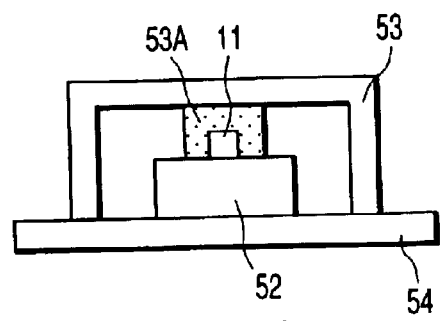
FIG. 9C is a front view showing the semiconductor laser device of the fifth embodiment from the side of a laser beam emission surface.

FIG. 9A is a plan view showing the structure of the semiconductor laser device of the fifth embodiment. FIG. 9B is a sectional view taken along a line 9B—9B in the plan view. FIG. 9C is a front view showing the semiconductor laser device from the side of a laser beam emission surface.

As shown in FIG. 9A, the center of the light receiving surface of a light receiving element 15 is deviated from a straight line (principal emission axis) which passes the emission point of a monitoring laser beam L2 and which is parallel to the principal emission direction of the monitoring laser beam L2. That is, when viewed in a direction perpendicular to the surface of a lead frame 54, the center of the light receiving surface of the light receiving element 15 is not present in the same plane as the principal emission axis. This arrangement includes a case in which the whole light receiving surface of the light receiving element 15 is deviated from the principal emission axis. In this case, the region of the light receiving surface of the light receiving element 15 is not present in the same plane as the principal emission axis, when viewed in the direction perpendicular to the surface of the lead frame 54.

The center of the light receiving surface of the light receiving element 15 is thus deviated from the principal emission axis in design, not accidentally by variations in the manufacture from the viewpoint of design. This arrangement is often made when the light receiving element 15 cannot be positioned in the center of the laser beam owing to limitations such as patterning of the lead frame and the outer dimensions of the semiconductor laser device.

Also, a light reflecting surface 53A is formed on a portion of a package 53 so as to intersect a plane (to be referred to as a principal emission plane hereinafter) which contains a straight line passing the emission point from which the monitoring laser beam L2 is emitted and parallel to the principal emission direction of the monitoring laser beam L2, and which is perpendicular to the lead frame surface. The light reflecting surface 53A reflects the monitoring laser beam L2 toward the light receiving element 15. To effectively reflect the monitoring laser beam L2 to the light receiving element 15, the light reflecting surface 53A is inclined a certain angle θ to the principal emission direction of the monitoring laser beam L2.

Even when the light receiving element 15 is deviated from the principal emission plane as described above, the light receiving element 15 can receive a sufficient amount of light if the light reflecting surface formed on a part of the package 53 is formed into an appropriate shape, e.g., a partial cylindrical surface shape, and is so inclined as to cross the principal emission plane at the appropriate angle θ. This significantly improves the degree of freedom of the placement of a semiconductor laser element 11. The light reflecting surface need only exist near the principal emission plane.

A portion of the light reflecting surface deviated from the principal emission plane can also be omitted as shown in FIG. 9C. This contributes to miniaturization of the semiconductor laser device.

Conventionally, it is essential to place a light receiving element on the emission axis of a laser beam. The fifth embodiment can eliminate such a structural limitation and makes free device design feasible.

In the conventional device using a lead frame, a light receiving element need be positioned as close as possible to the laser beam emission point, as described earlier, in order to increase the ratio of reception of the monitoring laser beam. In the fifth embodiment, however, the light receiving element need not be positioned near the emission point of the monitoring laser beam. As shown in FIG. 9B, the monitoring laser beam L2 can be well picked up with no problem even if a thick ceramic substrate 52 is inserted between the semiconductor laser element 11 and the lead frame 54. Even in this case, as described previously, the semiconductor laser device can be miniaturized by positioning the light reflecting surface as close as possible to the laser beam emission point of the semiconductor laser element 11.

In the semiconductor laser device having the conventional structure, insertion of the ceramic substrate intercepts the laser beam from the semiconductor laser element, and the further lowers the light receiving ratio. However, the structure of the semiconductor laser device of the fifth embodiment poses no such problem.

In the fifth embodiment, the semiconductor laser element 11 is mounted on the ceramic substrate 52 such that the laser element substrate opposes the ceramic substrate. The laser element has a structure in which a thin film about a few μm thick is stacked on a gallium-arsenic substrate about 100 μm thick by MOCVD. Therefore, the laser beam emission position is about a few μm from the mounting surface. The mounting method is used in order to efficiently radiate heat generated by the p-n junction surface (≈ laser beam emission position) toward the ceramic substrate 52 when the semiconductor laser element 11 is in operation.

When the above mounting method is used in the semiconductor laser device having the conventional structure, the difference between the height of the laser beam emission position and the height of light receiving surface of the light receiving element is at most about a few μm, so this is not a fatal problem in respect of the light receiving ratio. However, if the temperature characteristic of the semiconductor laser element itself is improved, the semiconductor laser element can be mounted such that its gallium-arsenic substrate opposes the ceramic substrate (the improves the ease of assembly). In this case, the semiconductor laser device of the fifth embodiment functions with no problem for the same reason as when the thick ceramic substrate described above is used. However, the conventional structure produces a difference corresponding to the gallium-arsenic substrate with respect to the height of the light receiving surface. This significantly lowers the light receiving ratio.

A semiconductor laser device according to a modification of the fifth embodiment will be explained below.

Figure 10A:
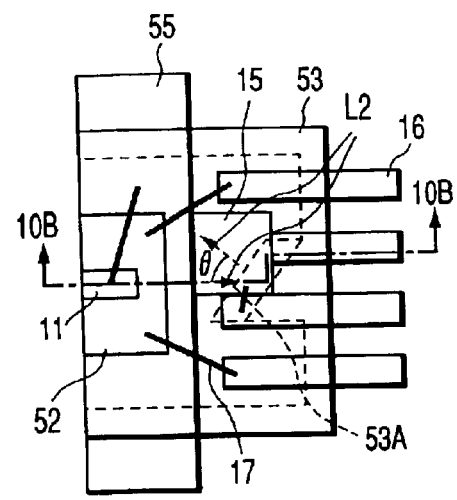
FIG. 10A is a plan view showing the structure of a semiconductor laser device according to a modification of the fifth embodiment of the present invention.
Figure 10B:
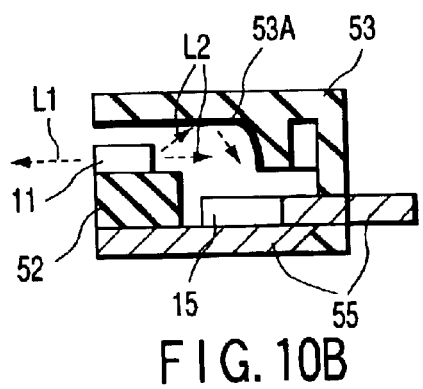
FIG. 10B is a sectional view taken along a line 10B—10B in the plan view shown in FIG. 10A.
Figure 10C:
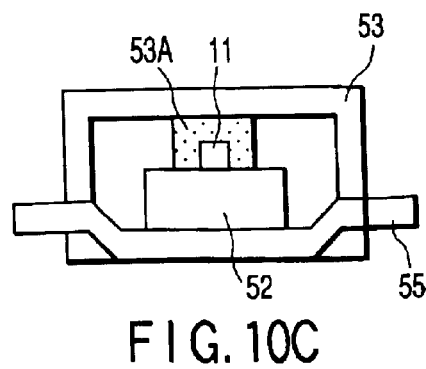
FIG. 10C is a front view showing the semiconductor laser device of the modification of the fifth embodiment from the side of a laser beam emission surface.

FIG. 10A is a plan view showing the structure of the semiconductor laser device according to the modification of the fifth embodiment. FIG. 10B is a sectional view taken along a line 10B—10B in the plan view. FIG. 10C is a front view showing the semiconductor laser device from the side of a laser beam emission surface.

As shown in FIGS. 10A to 10C, a lead frame 55 can be formed by performing appropriate forming for the semiconductor laser device of the fifth embodiment described above. By thus forming the lead frame 55, it is possible to adjust the extraction positions of leads for electrical connections and a slat from a package 53 and to prevent removal of these parts from the package 53. By properly using this forming, a short circuit can be prevented even when the semiconductor laser device is packaged into a metal pickup housing.

In the fifth embodiment and its modification as described above, the inner surface of a package is formed into a light reflecting surface, and the light reflecting surface is given a predetermined angle with respect to the emission direction of a monitoring laser beam, thereby reflecting the monitoring laser beam to a light receiving element. Accordingly, the monitoring laser beam which is conventionally absorbed and scattered as useless light by the surroundings is reflected toward a light receiving element and fed into the light receiving element. Consequently, the monitoring laser beam can be effectively used to check the state of a principal laser beam emitted from the semiconductor laser element. Also, the fifth embodiment and its modification can realize an inexpensive, highly productive, microminiature semiconductor laser device in which the light receiving efficiency of a monitoring laser beam is greatly increased without additionally installing any expensive component such as a reflecting plate.

Figure 11:
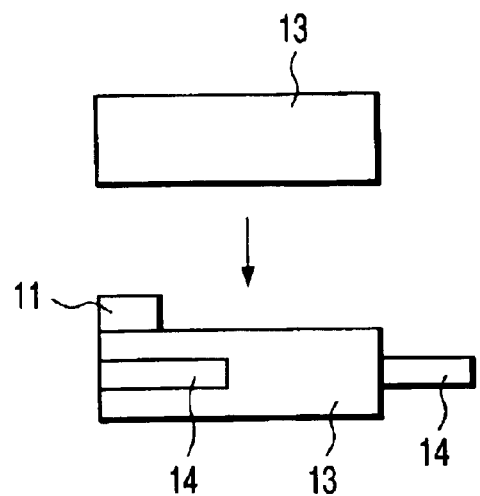
FIG. 11 is a side view of two, upper and lower packages used in the semiconductor laser device of each embodiment of the present invention.

FIG. 11 shows the way the upper and lower packages are combined into one package in the manufacture of the semiconductor laser device according to each embodiment of the present invention. FIG. 11 is a side view of the two, upper and lower packages used in the semiconductor laser device of each embodiment.

As shown in FIG. 11, a semiconductor laser element 11 is mounted on a lead frame 14. A lower package 13 is molded on the lead frame 14. An upper package 13 is adhered to the lower package 13. A method of thus combining the two, upper and lower packages into one package is applicable to the method of manufacturing the semiconductor laser device according to each embodiment of the present invention.

Figure 12:
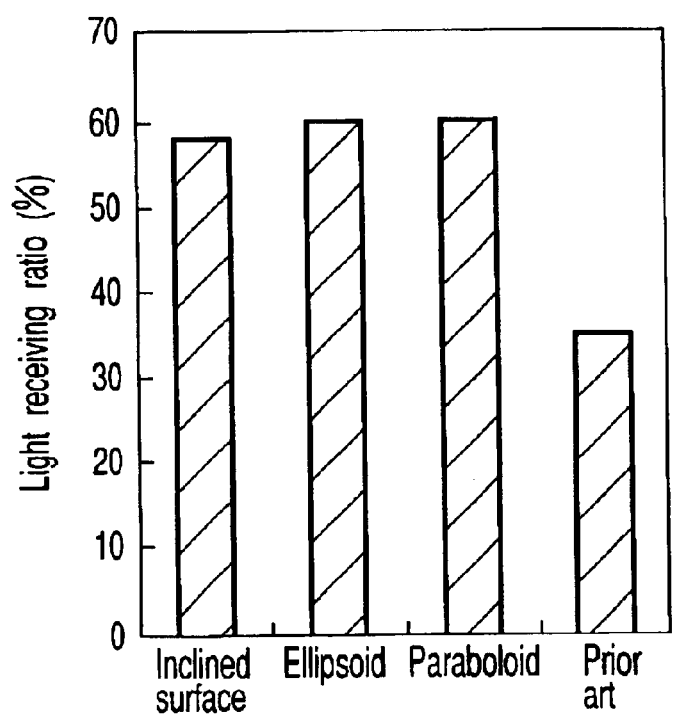
FIG. 12 is a graph showing the relationship between the light reflecting surface shape of the package and the ratio of reception of a monitoring laser beam in the semiconductor laser device of each embodiment of the present invention.

FIG. 12 shows the light receiving ratios obtained by the semiconductor laser devices of the embodiments of the present invention. FIG. 12 is a graph showing the relationship between the light reflecting surface shape of the package and the receiving ratio of the monitoring laser beam in the semiconductor laser device of each embodiment.

As shown in FIG. 12, a light receiving ratio about twice that of the prior art shown in FIGS. 1A to 1C or higher can be obtained regardless of whether the light reflecting surface shape of the inner surface of the package is inclined 45° (an inclined surface), is an ellipsoid, or is a paraboloid.

Also, the embodiments described above can be practiced singly or in the form of an appropriate combination. Furthermore, each embodiment includes inventions in various stages. So, inventions in various stages can be extracted by properly combining a plurality of components disclosed in these embodiments.

As has been described above, each embodiment of the present invention can provide a semiconductor laser device capable of increasing the ratio of reception of a monitoring laser beam by reflecting the monitoring laser beam, which is absorbed and scattered by the surroundings, toward a light receiving element, thereby allowing the monitoring laser beam to enter the light receiving element.

Additional advantages and modifications will readily occur to those skilled in the art. Therefore, the invention in its broader aspects is not limited-to the specific details and representative embodiments shown and described herein. Accordingly, various modifications may be made without departing from the spirit and scope of the general inventive concept as defined by the appended claims and their equivalents.

What is claimed is:

1. A semiconductor laser device comprising:

a semiconductor laser element having a first edge surface and a second edge surface positioned opposite to the first edge surface, a main laser beam being emitted from the first edge surface, a monitoring laser beam being emitted from the second edge surface, and the monitoring laser beam varying in accordance with the main laser beam and being used for monitoring the state of the main laser beam;

a chip-shaped light receiving element which receives the monitoring laser beam emitted from the second edge of the semiconductor laser element;

a flat plate on which said semiconductor laser element and said light receiving element are mounted; and a package which is arranged on the flat plate and surrounds said light receiving element, said package having a light reflecting surface on at least a portion of the inner surface and preventing the monitoring laser beam from transmitting, and the light reflecting surface reflecting at least a part of the monitoring laser beam emitted from the second edge surface toward the light receiving element.

2. The semiconductor laser device according to claim 1, wherein said light receiving element has a light receiving surface, and at least a portion of said light reflecting surface of said package opposes said light receiving surface.

3. The semiconductor laser device according to claim 2, wherein said light receiving surface of said light receiving element is parallel to a principal emission direction of said monitoring laser beam.

4. The semiconductor laser device according to claim 1, wherein at least a portion of said light reflecting surface of said package includes a concave surface.

5. The semiconductor laser device according to claim 4, wherein said concave surface includes an ellipsoid.

6. The semiconductor laser device according to claim 4, wherein said concave surface includes a paraboloid.

7. The semiconductor laser device according to claim 1, wherein at least a portion of said light reflecting surface of said package includes white.

8. The semiconductor laser device according to claim 1, wherein said light receiving element has a light receiving surface, and a center of the light receiving surface is deviated from a plane perpendicular to an upper surface of said flat plate, which contains a principal axis.

9. The semiconductor laser device according to claim 8, wherein said light reflecting surface of said package intersects a plane perpendicular to said upper surface of said flat plate; which contains a principal emission axis.

10. The semiconductor laser device according to claim 8, wherein said light receiving surface of said light receiving element is set at a height different from that of the surface on which said semiconductor laser element is mounted.

11. The semiconductor laser device according to claim 1, wherein said semiconductor laser element emits laser beams having not less than two different peak wavelengths.

12. The semiconductor laser device according to claim 11, wherein said laser beams having not less than two different peak wavelengths include in a red region and an infrared region.

13. A semiconductor laser device comprising:

a flat plate;

a semiconductor laser element mounted on the flat plate and having a first edge surface and a second edge surface positioned opposite to the first edge surface, a main laser beam being emitted from the first edge surface and a monitoring laser beam being emitted from the second edge surface, the monitoring laser beam varying in accordance with the main laser beam and being used for monitoring the state of the main laser beam;

a chip-shaped light receiving element which is mounted on the flat plate and receives the monitoring laser beam emitted from the second edge surface of the semiconductor laser element; and a package which surrounds the light receiving element mounted on the flat plate, said package having an inner surface facing the semiconductor laser element and said light receiving element and preventing the monitoring laser beam from transmitting and at least a portion of the inner surface of said package having a light reflecting surface.

14. The semiconductor laser device according to claim 13, wherein said light receiving element has a light receiving surface, and at least a portion of said light reflecting surface of said package opposes said light receiving surface.

15. The semiconductor laser device according to claim 14, wherein said light receiving surface of said light receiving element is parallel to a principal emission direction of said monitoring laser beam.

16. The semiconductor laser device according to claim 13, wherein at least a portion of said light reflecting surface of said package includes a concave surface.

17. The semiconductor laser device according to claim 16, wherein said concave surface includes an ellipsoid.

18. The semiconductor laser device according to claim 16, wherein said concave surface includes a paraboloid.

19. The semiconductor laser device according to claim 13, wherein at least a portion of said light reflecting surface of said package includes white.

20. The semiconductor laser device according to claim 13, wherein said light receiving element has a light receiving surface, and a center of the light receiving surface is deviated from a plane perpendicular to an upper surface of said flat plate, which contains a principal emission axis.

21. The semiconductor laser device according to claim 20, wherein said light reflecting surface of said package intersects a plane perpendicular to said upper surface of said flat plate, which contains a principal emission axis.

22. The semiconductor laser device according to claim 20, wherein said light receiving surface of said light receiving element is set at a height different from that of the surface on which said semiconductor laser element is mounted.

23. The semiconductor laser device according to claim 13, wherein said semiconductor laser element emits laser beams having not less than two different peak wavelengths.

24. The semiconductor laser device according to claim 23, wherein said laser beams having not less than two different peak wavelengths include in a red region and an infrared region.

* * * * *